(12) United States Patent
Davis et al.

(10) Patent No.: US 6,737,994 B2
(45) Date of Patent: May 18, 2004

(54) BINARY-ORDERED COMPRESSION FOR UNICODE

(75) Inventors: Mark Edward Davis, Menlo Park, CA (US); Markus Walter Scherer, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 187 days.

(21) Appl. No.: 10/144,384

(22) Filed: May 13, 2002

(65) Prior Publication Data

US 2003/0212696 A1 Nov. 13, 2003

(51) Int. Cl.[7] .............................. H03M 7/40; H03M 7/00
(52) U.S. Cl. .............................. 341/65; 341/50; 341/66; 341/90
(58) Field of Search .............................. 341/50, 51, 65, 341/90, 66; 345/467

(56) References Cited

U.S. PATENT DOCUMENTS 5,784,071 A * 7/1998 Tang et al. ................. 345/467
5,793,381 A * 8/1998 Edberg et al. ............... 345/467
6,204,782 B1 * 3/2001 Gonzalez et al. .............. 341/90

* cited by examiner

Primary Examiner—Jean Jeanglaude
(74) Attorney, Agent, or Firm—Michael J. Buchenhorner; Romualdas Strimaitis

(57) ABSTRACT

A system and method for encoding an input sequence of code points to produce an output sequence of bytes that is compressed, but has the same relative binary order as the original sequence. This system and method includes the following steps: (1) receiving the input sequence of code points, wherein each character is represented by a numeric value; (2) calculating a signed delta value for each code point in the input sequence, wherein each delta value is determined by subtracting the value of a base code point from the value of the current code point; (3) encoding each delta value into a series of bytes wherein small deltas are encoded in a small number of bytes and larger delta values are encoded in successively larger numbers of bytes; (4) selecting a lead byte for the output sequence, the lead byte being represented by a value, chosen so that the binary order of the output sequence is the same as the binary order of the input sequence; (5) writing the lead byte into the output sequence; and (6) writing to the output sequence each delta value for each trailing code point in the input sequence.

37 Claims, 5 Drawing Sheets

| Deltas | Lead Bytes | No. of Leads | Byte Count |
|---|---|---|---|
| 2F3F..10FFFF | EF..FF | 17 | 3 |
| 40..2F3F | C0..ED | 47 | 2 |
| 0..3F | 80..BF | 64 | 1 |
| -40..0 | 40..7F | 64 | 1 |
| -2F40..-41 | 11..3F | 47 | 2 |
| -10FFFF..-2F41 | 00..10 | 17 | 3 |

FIG. 3

| No. Leads | 1 | 1 | 62 | 64 | 64 | 62 | 1 | 1 |
|---|---|---|---|---|---|---|---|---|
| Length | 4 | 3 | 2 | 1 | 1 | 2 | 3 | 4 |
| Deltas Handled | 16,777,216 | 65,536 | 15,872 | 64 | 64 | 15,872 | 65,536 | 16,777,216 |

FIG. 4

| No. Leads | 1 | 0 | 8 | 2 | 7 | 8 | 2 | 8 | 0 | 1 |
|---|---|---|---|---|---|---|---|---|---|---|
| Length | 5 | 4 | 3 | 2 | 1 | 1 | 2 | 3 | 4 | 5 |
| Deltas Handled | 1,874,161 | 0 | 10,952 | 74 | 7 | 8 | 74 | 10,952 | 0 | 1,874,161 |

FIG. 5

| File | BOCU | UTF-16 | UTF-8 | B:16 | B:8 |
|---|---|---|---|---|---|
| german.txt | 3,472 | 6,846 | 3,474 | 51% | 100% |
| germanHR.txt | 12,339 | 24,298 | 12,328 | 51% | 100% |
| french.txt | 3,493 | 6,830 | 3,491 | 51% | 100% |
| frenchHR.txt | 12,521 | 24,258 | 12,495 | 52% | 100% |
| greek.txt | 4,246 | 7,148 | 6,317 | 59% | 67% |
| greekHR.txt | 15,232 | 25,164 | 22,832 | 61% | 67% |
| hindi.txt | 3,725 | 5,986 | 7,706 | 62% | 48% |
| japanese.txt | 2,510 | 3,168 | 4,403 | 79% | 57% |
| japaneseHR.txt | 8,640 | 9,456 | 12,971 | 91% | 67% |
| chinese.txt | 1,978 | 2,112 | 2,549 | 94% | 78% |
| chineseHR.txt | 6,569 | 6,324 | 8,809 | 104% | 75% |
| korean.txt | 3,490 | 3,174 | 3,662 | 110% | 95% |
| koreanHR.txt | 11,195 | 10,066 | 11,721 | 111% | 96% |
| koreanJamoHR.txt | 13,871 | 20,064 | 26,454 | 69% | 52% |
| Total: | 103,281 | 154,894 | 139,212 | 67% | 74% |

FIG. 6

| File | BOCU | UTF-16 | UTF-8 | B:16 | B:8 |
|---|---|---|---|---|---|
| german.txt | 6,793 | 6,846 | 3,474 | 99% | 196% |
| germanHR.txt | 24,206 | 24,298 | 12,328 | 100% | 196% |
| french.txt | 6,855 | 6,830 | 3,491 | 100% | 196% |
| frenchHR.txt | 24,588 | 24,258 | 12,495 | 101% | 197% |
| greek.txt | 7,195 | 7,148 | 6,317 | 101% | 114% |
| greekHR.txt | 25,832 | 25,164 | 22,832 | 103% | 113% |
| hindi.txt | 6,304 | 5,986 | 7,706 | 105% | 82% |
| japanese.txt | 4,383 | 3,168 | 4,403 | 138% | 100% |
| japaneseHR.txt | 15,172 | 9,456 | 12,971 | 160% | 117% |
| chinese.txt | 3,374 | 2,112 | 2,549 | 160% | 132% |
| chineseHR.txt | 10,889 | 6,324 | 8,809 | 172% | 124% |
| korean.txt | 5,531 | 3,174 | 3,662 | 174% | 151% |
| koreanHR.txt | 17,809 | 10,066 | 11,721 | 177% | 152% |
| koreanJamoHR.txt | 23,903 | 20,064 | 26,454 | 119% | 90% |
| Total: | 182,834 | 154,894 | 139,212 | 118% | 131% |

FIG. 7

BINARY-ORDERED COMPRESSION FOR UNICODE

FIELD OF THE INVENTION

The invention disclosed broadly relates to the field of information handling systems, and more particularly to the field of data compression.

BACKGROUND OF THE INVENTION

Expressing the same digital information with fewer bits is a continuing challenge in the field of information technology. This is particularly the case with the various standard character sets have been adopted for expressing alphanumeric characters in digital form. One case is Unicode, a superset of the ASCII (American Standard Code for Information Interchange) character set that uses two or more bytes for each character so that it can house the alphabets of most of the world's languages. Under the Unicode scheme, as in others, a unique number represents each character. Other character sets use a different set of digital numbers to represent characters. Unicode generally requires more data to specify alphanumeric characters than ASCII because it can express characters in various alphabets. There is thus a need for a compression method for Unicode that is well suited for certain classes of applications, such as large databases. There is a further need for a compression method that compresses small strings well, such as individual fields in a database. These are situations where compression mechanisms such as LZW (Lempel-Ziv-Welch) do not work well because they are better suited to large bodies of text. In addition, there is a need for one very important characteristic: binary comparison. For many applications, it is very important that databases be able to have the same binary order for compressed Unicode fields as they do for uncompressed fields. Other encoding schemes such as SCSU use essentially random binary order, which makes them unsuitable in many applications.

SUMMARY OF THE INVENTION

Briefly, according to the invention, a system and method for encoding an input sequence of code points to produce an output sequence of bytes include the steps of:

receiving a plurality of values, each value representing a code point (character) in the input sequence;

calculating a signed delta value for each code point in the input sequence, wherein each delta value is determined by subtracting the value of a base code point from the value of the current code point to produce the delta value for the current code point;

encoding each delta value into a set of bytes wherein small deltas are encoded in a small number of bytes and larger delta values are encoded in successively larger numbers of bytes;

selecting a lead byte value for the output sequence so that the binary order of the output sequence is the same as the binary order of the input sequence;

writing to the output sequence each delta value for each code point in the input sequence.

BRIEF DESCRIPTION OF THE DRAWINGS

FIG. 3 shows a table of lead bytes and deltas for selecting a lead byte.

FIG. 4 shows a table for using a modified distribution of lead bytes.

FIG. 5 shows a table for use in situations where the number of byte values is restricted.

FIG. 6 shows a table describing test results when comparing BOCU with UTF-8 and UTF-16.

FIG. 7 shows a table describing test results as in FIG. 6 but using a version of BOCU having only 37 allowable bytes.

DESCRIPTION OF THE PREFERRED EMBODIMENT

Figure 1:
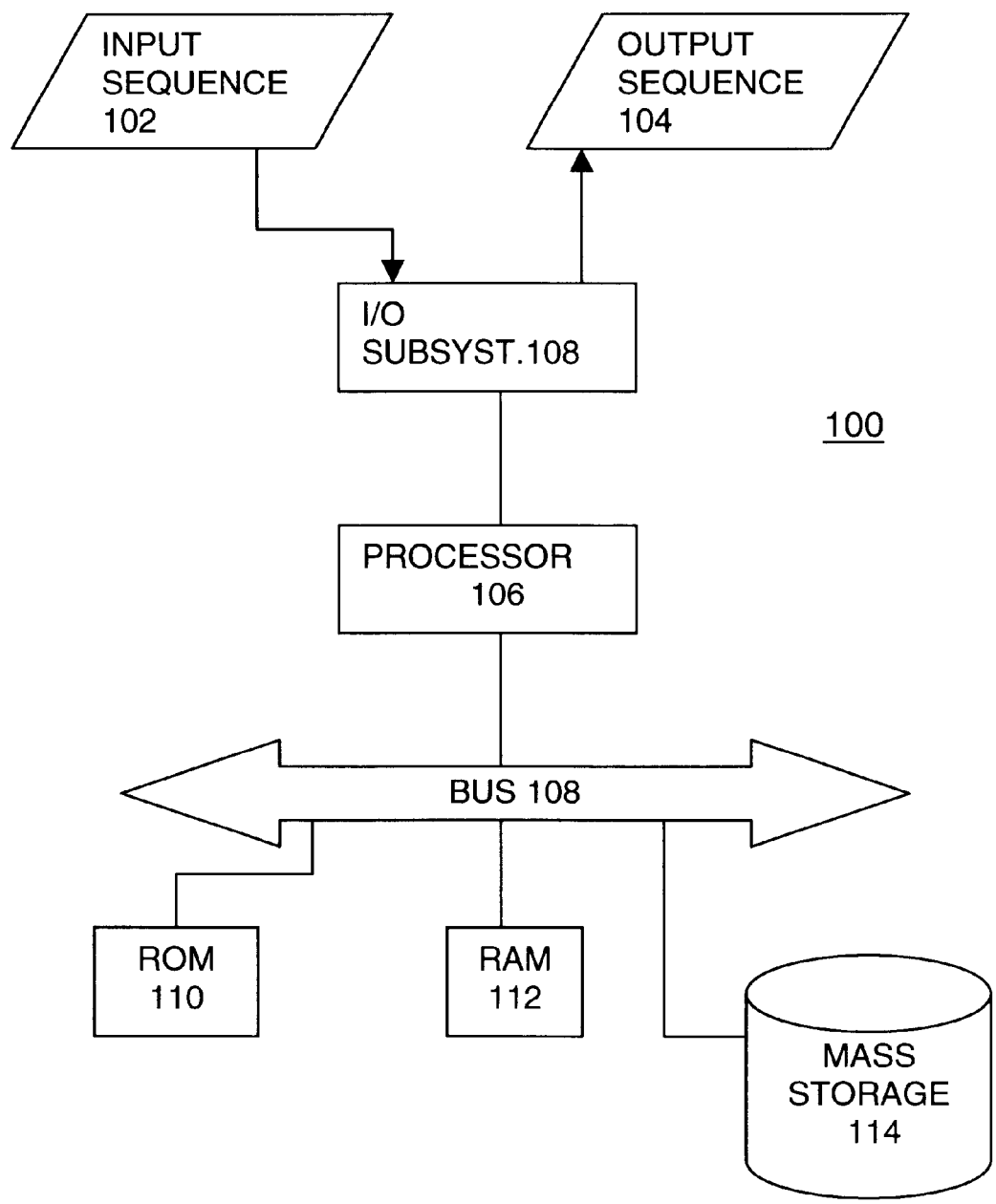
FIG. 1 is an illustration of a data compression system according to the present invention.

Referring to FIG. 1, there is shown a block diagram of a data compression system 100 according to the invention. The system 100 uses a new, general compression format for Unicode. The system comprises an input/output subsystem 104, and a processor 106 coupled to a system bus 108. The system 100 also comprises various forms of data storage including a read-only memory, system working memory (e.g., RAM) 112, and a mass storage device (e.g., rotating hard disk) 114. The elements of system 100 shown in this figure are illustrative and the system comprises many other subsystems and components that are not shown here for purposes of brevity.

An input sequence 102 is received at the input/output subsystem 108. A working copy of the sequence 102 is stored in the system memory 112 and is encoded by the processor 106 to produce an encoded output sequence 104. Alternatively, the input sequence could be received from storage 114, encoded and the encoded sequence could be written back to storage 114 or transmitted to another data processing system or network via I/O subsystem 108. The computer-readable instructions that control the execution of the encoding algorithm are stored in a medium such as a hard disk drive 1110 or other media such as a diskette, CD ROM, or DVD disk.

According to an embodiment of the invention, a compression technique called "binary-ordered compression for Unicode," or BOCU, for short, is used. The BOCU encoding method has a number of important advantages over other compression mechanisms that make it well suited for certain classes of applications, such as large databases. It compresses small strings well, such as individual fields in a database. These are situations where compression mechanisms like LZW do not work well; they are better suited to large bodies of text. In addition, it preserves one very important characteristic: binary comparison. For many applications, it is very important that databases be able to have the same binary order for compressed Unicode fields as they do for uncompressed fields.

Figure 2:
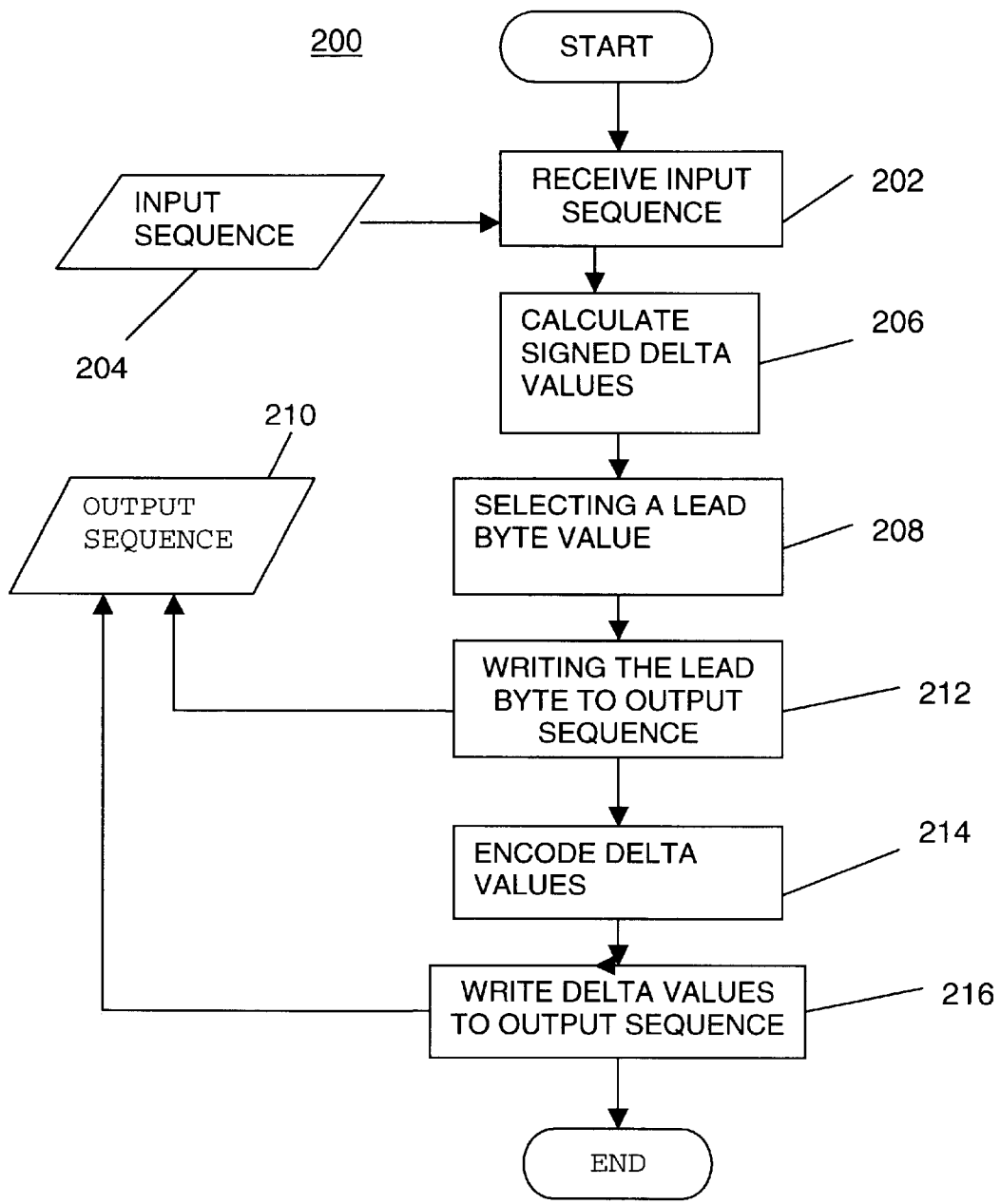
FIG. 2 shows a flow chart of method embodying the invention.

Referring to FIG. 2, there is illustrated a method 200 embodying the invention. In step 202 an input sequence 204 is received. The input sequence includes a first input value, representing a first code point in the input sequence of code points, and subsequent input values each representing a subsequent code point in the input sequence. These values are determined by the particular coding scheme used to encode the input sequence. In the preferred embodiment the Unicode scheme is used.

In step 206 a signed delta value is calculated for each subsequent code point in the received sequence. Each delta value is calculated by subtracting the value of the last (base) code point from value of the current code point to produce a signed delta value that preferably can range from −10FFFF to 10FFFF. For example if the input sequence is "ABC" the output sequence is written as "011" and the input sequence "CBA" is encoded as "2-1-1." (These examples use an initial base code point of "A" for illustration)

In step 208 a lead byte value for the output sequence is selected so that the binary order of the output sequence is the same as the binary order of the input sequence. In other words, if the value of a first input character is greater than the value of a second input character then the relationship remains the same for the respective encoded output values.

In step 212, the selected lead byte value is written into the output sequence 210. In step 214 each delta value is encoded into a set of bytes wherein small deltas are encoded in a small number of bytes and larger delta values are encoded in successively larger numbers of bytes. Similar differencing processes are known (for example, see: "Ultracode: A Barcode Symbology Encoding Unicode 2.0," (www.unicode.org/iuc/iuc 10/program.html). In step 216 each delta value for each subsequent code point in the input sequence is written to the output sequence.

As discussed above, an enhancement on the foregoing differencing technique is to choose the lead (first) byte of each of the sequences so that the binary order is correct (i.e., the order of the output sequence 112 is the same as that of the input sequence 102, see step 212). This is preferably done by clustering the single byte differences around 128, then moving outwards, the double-byte differences, and then triple bytes. The table shown in FIG. 3 shows one way to accomplish this result. Other ways to accomplish this are possible and each depends on the information to be encoded.

Referring to FIG. 3, the Lead Bytes are the values of the first byte of the sequence used to represent each delta. The Number of Leads indicates how many values there are. The Byte Count indicates the total number of bytes in the sequence, including the lead byte and any trailing byte (for the single-byte forms there are no trail bytes). The values shown are for illustration other values may be used depending on the application.

The values should preferably be chosen so that small alphabets fit in the single-byte range, while the double-byte range covers at least the 20,902 CJK (Chinese, Japanese, and Korean) Ideograph values. The sequences must, as we said before, cover the range of values from −10FFFF to 10FFFF. Note that this is different from UTF-8, for example, which only needs to cover half that range.

The method can be further enhanced by forming the delta values by looking at the last code point, which called the base value. These delta values can be the single-byte values shown in the table of FIG. 3. These values range from 0 to 63 ($3F_{16}$) on the positive side, and from −1 to −64 ($40_{16}$) on the negative side. While most small alphabets fit within a range of 128 values, there may be more than 64 code points between the top and the bottom of the range. Thus, when the distance between the base code point and the new one exceeds the difference value that can be stored in a single byte then two bytes are used.

Since the vast majority of small alphabets are aligned on 128-byte boundaries, the solution here is to adjust the base to always be in the middle of each 128-byte range. This is done as shown below:

baseCp=(baseCp & ~0x7F)+0x40;

With this, values from xxxx00 to xxxx7F become xxxx40, values from xxxx80 to xxxxFF become xxxxC0. When we then get the difference from the base code point, any values within the 128 range are reachable with a single byte.

The same logic can apply to the two-byte case. In particular, we would like to be able to have sequences of CJK characters only take two bytes each. We can do this by having special range checks. For examples, see the sample code below.

The second optional enhancement is to use more than just the last code point in computing the base value. Many non-Latin alphabets use spaces between words. As long as the text stays in that alphabet, the characters are encoded in a single byte. However, every time a space is hit, it forces a "long jump" down to pick up 0020, then another "long jump" back up to the alphabet. BOCU saves half of this cost by looking back at more than just the last code point. Instead, the last three code points are used. If the adjusted values of any two of them are the same, then that value is used. Otherwise, the adjusted value of the last code point is used. As it turns out, this is simple to implement:

int last=simpleAdjust(lastCp);

int result=wasSame ? prelast: last;

wasSame=prelast==last;

prelast=last;

return result;

Once these adjustments are made, we can use a modified distribution of lead bytes. This provides for 128 single-byte sequences, and over 31 thousand double-byte sequences.

Even with all of these manipulations, any resulting byte sequence still has the same binary order as the original code point sequence did. Suppose there are two code point sequences C and D which are identical up to and including code point number n, and differ at code point n+1. Since the X sequence C[0]. . . C[n] equals the sequence D[0]. . . D[n], the byte sequences generated from these will be the same.

So now look at the code points C[n+1] and D[n+1]. Since C[n]=D[n], baseCp will also be the same for both sequences. This is true even if we adjust baseCp as above: as long as it is completely determined by the sequence of preceding code points C[0]. . . C[n] (which equals D[0]. . . D[n]), we can choose whatever value we want. Subtracting the baseCp value will result in two delta values x and y. And x>y, if and only if C[n+1]>D[n+1].

From x and y we will generate two byte sequences bx and by. By the way in which we assign values described above, if bx and by have different lead bytes, then those bytes are in the correct binary order and will correctly determine the order of the sequence. If bx and by have the same lead byte, then they must have the same number of bytes. In that case, one of the trailing bytes will differ, and determine the correct order.

With a minor change in algorithm, BOCU can also use a binary order that is the same as UTF-16, instead of being the same as UTF-8.

Restricted Byte Values.

There are situations where the actual byte values used may be restricted, as mentioned above. To adapt BOCU to those cases, we may need to modify the number of lead bytes to still obtain good ranges for values. For example, if working with a very limited repertoire of 37 allowable bytes, the table of FIG. 4 can be used to modify the number of leads bytes.

As before, we try to make sure that the CJK and small alphabets are covered. This is done by allocating 148 two-byte values for small alphabets, allocating 21,904 three-byte values for CJK coverage. We distribute the rest so that we have most of the BMP covered in four bytes, with the five bytes form ensuring that the entire codepoint range is covered. The remainder is in single bytes, to pick up as many small-delta cases as we can.

When computing the actual bytes, the simplest case is where the usable byte values are in a contiguous range. For example, in ICU collation the byte values 03 . . . FF are usable (00, 01, and 02 cannot be used). In that case, we find the number of allowable values (count=253) and an offset to the first value (offset=3).

To compute the trailing bytes, we use successive divisions and modulos, going from the last byte to the first byte:

output[m]=delta % trailCount+trailOffset;

delta/=trailCount;

After all the trailing bytes are output, the remaining delta is used in computing the lead byte. If the allowable bytes are discontiguous, then instead of using an offset, we use an array, such as:

output[m]=map[delta % trailCount];

delta/=trailCount;

The map function (or the offset) is used to get the proper byte values. For more details on this, see the code sample below.

MIME-Friendly

A variant of BOCU, called BOCU-1, is MIME-compatible. In this variant, the C0 control codes NUL, CR and LF and nine others are encoded with the same byte values as in US-ASCII, and those byte values are used only for the encoding of these twelve C0 control codes. This makes BOCU-1 suitable for MIME "text" media types, directly usable in emails and generally "friendly" for ASCII-based tools. The SUB control and its byte value IA is included in this set to avoid problems in DOS/Windows/OS/2 systems where 1A is interpreted as an end-of-file marker in text mode.

BOCU-1 differs from the generic algorithm by using a different set of byte value ranges and by encoding U+0000 . . . U+0020 directly with byte values 00 . . . 20. In addition, the space character U+0020 does not affect the state. This is to avoid large difference values at the beginning and end of each word.

The state is reset at each C0 control (U+0000 . . . U+001F, including CR, LF, TAB). CRLF-separated lines do not affect each other's encoding. Together with BOCU-1 being deterministic, this allows line-based file comparisons (diff) and makes BOCU-1 usable with RCS, CVS and other source-code control systems (unlike SCSU). This also allows some limited random access.

Self-Synchronization

Both UTF-8 and UTF-16 have the very important property of self-synchronization; also called non-overlap. What this means is that the lead bytes (16-bit units in the case of UTF-16) do not overlap in value with the trail bytes. This allows a number of important characteristics:

(1) one can randomly access within strings, since one can always easily determine code point boundaries;

(2) if a byte is damaged (changed, omitted, or inserted) in transmission, it only affects the adjacent code points; the rest of the string is untouched; and (3) one can never get a "false positive" when searching (e.g., when searching for one UTF-8 string within another, a match will never be found except at code point boundaries).

BOCU can be modified to also have characteristics (1) and (2), if desired. While this is not generally a design goal for compression, there may be environments where this is necessary. The downside is that the compression is not nearly as good.

Self-synchronization can be done by allocating certain byte values to leads and the rest to trails. In the general case, this means having different leadMap and trailMap arrays, and redistributing the lead bytes and number of trail bytes to get the correct coverage. For an example of an extreme case, suppose that we take the limited repertoire of 37 allowable byte values. We could allocate 22 values to trail bytes, and 15 values to lead bytes.

Referring to FIG. 6, the table shown describes test results when comparing BOCU against UTF-8 and UTF-16. The sample files are taken from http://www.unicode.org/unicode/standard/WhatIsUnicode.html (for the plain files) and http://www.unhchr.ch/udhr/navigate/alpha.htm (for the files marked with "HR"). The columns for BOCU, UTF-16 and UTF-8 contain the respective number of bytes of storage for each form for that file. The column heading B:16 is the size of BOCU compared to UTF-16, and B:8 is the size compared to UTF-8.

Overall, for these samples, BOCU takes about one-third less storage than UTF-16, and about one-quarter less storage than UTF-8. Note that in the case of Korean, BOCU is not quite as good as UTF-16. This is because Korean uses a large character set, plus spaces. The spaces require 3 bytes in those circumstances, which detracts from the compression. This does not happen with Japanese or Chinese. For comparison, the koreanHR.txt file is also given in Jamo form (with the Hangul Syllables decomposed). That would get much better compression, except that the layout of the encoding of the Jamo make the alphabet too large to really benefit.

For comparison, here is the variant BOCU using only 37 allowable bytes. The storage costs are roughly the same as UTF-16 for small alphabets, and somewhat more than UTF-8 for large alphabets. Not too bad, given only 37 allowable byte values.

The following are extracts from sample code of the encoding and decoding. This code is for illustrative purposes only, and is not optimized.

```
/**
 * Convert a Java string (UTF-16) to BOCU compressed format.
 * @return number of bytes actually written.
 */
// Note: the following code is designed for simplicity
// it can be recoded for speed.
public int toBOCU (char[] input, int iStart, int iEnd, byte[] output, int oStart, int oEnd) {
    int oldCodePoint = 0;
    int iPosition;
    int cp;
    int oPosition = oStart;
```

```
        adjuster.reset ();
        for (iPosition = iStart; iPosition < iEnd; iPosition += UTF32.count16(cp)) {
            // get code point, and adjust
            cp = UTF32.char32At(input, iPosition, iEnd);
            int delta = cp - adjuster.adjust(oldCodePoint);
            oldCodePoint = cp;
            // now encode delta
            for (int i = 0; ; ++i) {
                // find the proper range
                if (delta < boundary[i]) { // always terminates
                    // set up to store values from the end backwards
                    delta += offset[i]; // important: delta is now positive!
                    int bCount = count[i];
                    oPosition += bCount;
                    if (oPosition > oEnd) {
                        throw new IllegalArgumentException("Output buffer too short!");
                    }
                    int backup = oPosition;
                    // store trailing bytes (bCount - 1 bytes)
                    while (--bCount > 0) {
                        output[--backup] = toTrailBOCU[delta % radix];
                        delta /= radix;
                    }
                    // store lead byte
                    output[--backup] = toLeadBOCU[delta];
                    break;
                }
            }
        }
        return oPosition;
    }
// ==================================================================
    /**
     * Converts from BOCU format back into a Java (UTF-16) character string.
     * @return number of characters (UTF-16 code units) actually written.
     */
    public int fromBOCU(byte[] input, int iStart, int iEnd, char[] output, int oStart, int oEnd) {
        // Note: bytes are masked with FF, since Java doesn't have unsigned byte
        int oldCodePoint = 0;
        int iPosition;
        int oPosition = oStart;
        int normByte;
        adjuster.reset();
        for (iPosition = iStart; iPosition < iEnd;) {
            // get first byte, tells us count and the initial part of cp
            // as an optimization, 3 arrays could be combined to 2.
            int delta = fromLeadBOCU[input[iPosition++] & 0xFF];
            if (delta == Short.MIN_VALUE) {
                throw new IllegalArgumentException("Invalid Lead Byte: " + Utility.hex(delta));
            }
            int group = groupFromValue[delta];
            int bCount = count[group];
            // get rest of the parts of the delta
            while (--bCount > 0) {
                delta *= radix;
                if (iPosition >= iEnd) {
                    throw new IllegalArgumentException("Byte sequence cut off!");
                }
                normByte = fromTrailBOCU[input[iPosition++] & 0xFF];
                if (normByte == Short.MIN_VALUE) {
                    throw new IllegalArgumentException("Invalid Trail Byte: " +
Utility.hex(normByte));
                }
                delta += normByte;
            }
            // fix by offset, then
            // adjust, since we just have a delta at this point
            delta -= offset[group];
            int cp = adjuster.adjust(oldCodePoint) + delta;
            oldCodePoint = cp;
            if (cp < 0 || cp > 0x10FFFF) {
                throw new IllegalArgumentException("Illegal code point: " + Utility.hex(cp));
            }
            // Store cp in UTF-16 array
            oPosition = UTF32.setChar32At(output, oPosition, oEnd, cp);
        }
        return oPosition;
    }
// ==================================================================
```

-continued

```
// used in the adjuster
   int simpleAdjust(int cp) {
      if (style == HALF_BLOCK) return (cp & ~0x7F) + 0x40;
      // for large sets (CJK), align multibyte range of over 21K
      if (cp >= 0x4E00 && cp <= 0x9FA5) { // CJK
         return alignTo(cp, 0x3000, cjkLowSpan, cjkHighSpan);
      }
   if (cp >= 0xAC00 && cp <= 0xD7AF) { // Hangul
      return alignTo(cp, 0xAC00, cjkLowSpan, cjkHighSpan);
   }
   // handle badly aligned blocks
   int offset = 0;
   if (cp > 0x3040 && cp <= 0x30A0) offset = 0x40; // Hiragana
   else if (cp > 0x30A0 && cp <= 0x30FF) offset = 0x20; // Katakana
   else if (cp > 0xFF60 && cp <= 0xFF9F) offset = 0x60; // HW Katakana
   // align to start of half-byte + offset
   return alignTo(cp, (cp & ~0x7F) + offset, alphabetLowSpan, alphabetHighSpan);
   }
}
/**
 * Utility used to align a code point
 */
private int alignTo(int cp, int start, int lowSpan, int highSpan) {
   int factor = lowSpan + highSpan;
   return ((cp - start) / factor) * factor + start + lowSpan;
}
```

Therefore, while there has been described what is presently considered to be the preferred embodiment, it will be understood by those skilled in the art that other modifications can be made within the spirit of the invention.

What is claimed is:

1. A method for encoding an input sequence of code points to produce an output sequence of bytes, comprising the steps of:
   receiving a plurality of values, each value representing a code point in the input sequence;
   calculating a signed delta value for each code point in the input sequence, wherein each delta value is determined by subtracting the value of a base code point from the value of the current adjusted code point to produce the delta value for the current code point;
   encoding each delta value into a set of bytes wherein small deltas are encoded in a small number of bytes and larger delta values are encoded in successively larger numbers of bytes;
   selecting a lead byte value for the output sequence of bytes so that the binary order of the output sequence is the same as the binary order of the input sequence;
   writing to the output sequence each delta value for each code point in the input sequence.

2. The method of claim 1, wherein the step of selecting a lead byte for the output sequence comprises selecting single byte deltas close to the value 128.

3. The method of claim 1 wherein the step of calculating a signed delta value comprises selecting delta values in the range of −10FFFF(hex) to 10FFFF(hex).

4. The method of claim 2 wherein the step of selecting a lead byte for the output sequence further comprises selecting double-byte deltas and three-byte deltas close to a value that span a range of approximately 20,000, so that CJK characters are within a two-byte range.

5. The method of claim 1 further comprising adjusting the value of the base value to be in the middle of a range of byte boundaries for the alphabet of the characters in the input sequence.

6. The method of claim 5 wherein the range is 128 bytes.

7. The method of claim 1 wherein selecting a lead byte for the output sequence is done according to the following table:

| Deltas | Lead Bytes | No. of Leads | Byte Count |
| --- | --- | --- | --- |
| 2F3F ... 10FFFF | EF ... FF | 17 | 3 |
| 40 ... 2F3F | C0 ... ED | 47 | 2 |
| 0 ... 3F | 80 ... BF | 64 | 1 |
| −40 ... 0 | 40 ... 7F | 64 | 1 |
| −2F40 ... −41 | 11 ... 3F | 47 | 2 |
| −10FFFF ... −2F41 | 00 ... 10 | 17 | 3. |

8. The method of claim 1 wherein the step of calculating a signed delta value comprises using the last three code points of the input sequence in computing the base value such that if the adjusted values of any two of the last three code point values are the same then that value is used and else using the base value.

9. The method of claim 1, wherein characters in the range U+0000 ... U+0020 are always encoded as bytes 00 ... 20 for compatibility with MIME and other standards requiring stability of control codes, and thus the values in claim 7 are adjusted accordingly.

10. The method of claim 1, wherein different lead-byte values and different trail sequence lengths are chosen for environments where bytes are restricted to a smaller set.

11. The method of claim 1, wherein the space character U+0020 never causes a reset, thus not requiring a "jump" to and from the space within strings of characters with higher code point numbers.

12. The method of claim 10 wherein the smaller set is the 37 distinct values possible in email headers.

13. The method of claim 11 wherein the characters requiring higher code point numbers are Greek.

14. A computer readable medium for encoding an input sequence of code points to produce an output sequence of bytes, comprising computer-executable instructions for:
   receiving the input sequence of code points, wherein each character is represented by a numeric value, and the plurality of code points comprises a first code point followed by a plurality of trailing code points;
   calculating a signed delta value for each code point in the input sequence, wherein each delta value is determined by subtracting the value of a base code point from the value of the current code point;

encoding each delta value into a series of bytes wherein small deltas are encoded in a small number of bytes and larger delta values are encoded in successively larger numbers of bytes;

selecting a lead byte for the output sequence, the lead byte being represented by a first value, so that the binary order of the output sequence is the same as the binary order of the input sequence;

writing the lead byte into the output sequence; and writing to the output sequence each delta value for each trailing code point in the input sequence.

15. The computer-readable medium of claim 14, wherein the instruction for selecting a lead byte for the output sequence comprises selecting single byte deltas close to the value 128.

16. The computer-readable medium of claim 14, wherein the instruction for calculating a signed delta value comprises selecting delta values in the range of −10FFFF(hex) to 10FFFF(hex).

17. The computer-readable medium of claim 14, wherein the instruction for selecting a lead byte for the output sequence further comprises selecting double-byte deltas close to a value higher than 128.

18. The computer-readable medium of claim 14, wherein the instruction for adjusting the value of the base value to be in the middle of the range of byte boundaries for the alphabet of the characters in the input sequence.

19. The computer-readable medium of claim 14, wherein the range is 128 bytes.

20. The computer-readable medium of claim 14, wherein the instruction for selecting a lead byte for the output sequence is done according to the following table:

| Deltas | Lead Bytes | No. of Leads | Byte Count |
|---|---|---|---|
| 2F3F . . . 10FFFF | EF . . . FF | 17 | 3 |
| 40 . . . 2F3F | C0 . . . ED | 47 | 2 |
| 0 . . . 3F | 80 . . . BF | 64 | 1 |
| −40 . . . 0 | 40 . . . 7F | 64 | 1 |
| −2F40 . . . −41 | 11 . . . 3F | 47 | 2 |
| −10FFFF . . . −2F41 | 00 . . . 10 | 17 | 3. |

21. The computer-readable medium of claim 14, wherein the instruction for calculating a signed delta value comprises using the last three code points in computing the base value such that if the adjusted values of any two of the last three code point values are the same then that value is used and else using the base value.

22. The computer-readable medium of claim 14, wherein characters in the range U+0000 . . . U+0020 are always encoded as bytes 00 . . . 20 for compatibility with MIME and other standards requiring stability of control codes and thus the values in claim 7 are adjusted accordingly.

23. The computer-readable medium of claim 14, wherein the space character U+0020 never causes a reset, thus not requiring a "jump" to and from the space within strings of characters with higher code point numbers.

24. The computer-readable medium of claim 23 wherein the characters requiring higher code point numbers are Greek.

25. The computer-readable medium of claim 14, wherein different lead-byte values and different trail sequence lengths are chosen for environments where bytes are restricted to a smaller set.

26. The computer-readable medium of claim 25 wherein the smaller set is the 37 distinct values possible in email headers.

27. A system for encoding an input sequence of code points to produce an output sequence of bytes, comprising:

a receiver for receiving a first input value representing a first code point in the input sequence of code points and a plurality of subsequent values, each subsequent value representing a subsequent code point in the input sequence;

processing apparatus for calculating a signed delta value for each code point in the input sequence, wherein each delta value is determined by subtracting the value of a base code point from the value of the current adjusted code point to produce the delta value for the current code point;

an encoder for encoding each delta value into a set of bytes wherein small deltas are encoded in a small number of bytes and larger delta values are encoded in successively larger numbers of bytes;

processing apparatus for selecting a lead byte value for the output sequence of bytes so that the binary order of the output sequence is the same as the binary order of the input sequence, writing the lead byte value into the output sequence, and writing to the output sequence each delta value for each subsequent code point in the input sequence.

28. The system of claim 27, wherein selecting a lead byte for the output sequence comprises selecting single byte deltas close to the value 128.

29. The system of claim 27 wherein calculating a signed delta value comprises selecting delta values in the range of −10FFFF(hex) to 10FFFF(hex).

30. The system of claim 27 wherein selecting a lead byte for the output sequence further comprises selecting double-byte deltas and three-byte deltas close to a value that span a range of approximately 20,000, so that CJK characters are within a two-byte range.

31. The system of claim 27 further comprising processing apparatus for adjusting the value of the base value to be in the middle of a range of byte boundaries for the alphabet of the characters in the input sequence.

32. The system of claim 27 wherein the range is 128 bytes.

33. The system of claim 27 wherein selecting a lead byte for the output sequence is done according to the following table:

| Deltas | Lead Bytes | No. of Leads | Byte Count |
|---|---|---|---|
| 2F3F . . . 10FFFF | EF . . . FF | 17 | 3 |
| 40 . . . 2F3F | C0 . . . ED | 47 | 2 |
| 0 . . . 3F | 80 . . . BF | 64 | 1 |
| −40 . . . 0 | 40 . . . 7F | 64 | 1 |
| −2F40 . . . −41 | 11 . . . 3F | 47 | 2 |
| −10FFFF . . . −2F41 | 00 . . . 10 | 17 | 3. |

34. The system of claim 27 wherein calculating a signed delta value comprises using the last three code points of the input sequence in computing the base value such that if the adjusted values of any two of the last three code point values are the same then that value is used and else using the base value.

35. The system of claim 27, wherein characters in the range U+0000 . . . U+0020 are always encoded as bytes 00 . . . 20 for compatibility with MIME and other standards requiring stability of control codes and thus the values in claim 7 are adjusted accordingly.

36. The system of claim 27, wherein the space character U+0020 never causes a reset, thus not requiring a "jump" to and from the space within strings of characters with higher code point numbers.

37. The system of claim 27, wherein different lead-byte values and different trail sequence lengths are chosen for environments where bytes are restricted to a smaller set.

* * * * *